(12) United States Patent
Ina (10) Patent No.: US 9,760,000 B2
(45) Date of Patent: Sep. 12, 2017

(54) IMPRINT APPARATUS, IMPRINT METHOD, AND ARTICLE MANUFACTURING METHOD

(75) Inventor: Hideki Ina, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 519 days.

(21) Appl. No.: 12/950,695

(22) Filed: Nov. 19, 2010

(65) Prior Publication Data

US 2011/0151124 A1 Jun. 23, 2011

(30) Foreign Application Priority Data

Dec. 21, 2009 (JP) .................................. 2009-288817

(51) Int. Cl.
- *B29C 59/02* (2006.01)
- *B82Y 40/00* (2011.01)
- *G03F 7/00* (2006.01)
- *B41J 25/00* (2006.01)
- *B82Y 10/00* (2011.01)

(52) U.S. Cl.
CPC ............ *G03F 7/0002* (2013.01); *B29C 59/02* (2013.01); *B41J 25/001* (2013.01); *B82Y 10/00* (2013.01); *B82Y 40/00* (2013.01)

(58) Field of Classification Search
CPC ... B82Y 40/00; G03F 7/002; B29C 2059/022; B29C 2059/023; B29C 59/02; B29C 59/022; B29C 59/046; B41J 25/001; B41J 25/003
USPC ........................................................ 118/313
See application file for complete search history.

(56) References Cited

U.S. PATENT DOCUMENTS

| 2006/0246212 A1* | 11/2006 | Takahashi et al. ........... 118/313 |
| 2007/0289530 A1* | 12/2007 | Kataho et al. ................ 118/320 |
| 2008/0018875 A1* | 1/2008 | Schram et al. ................. 355/67 |

FOREIGN PATENT DOCUMENTS

| JP | 2004-335011 A | 11/2004 |
| JP | 2007-273979 A | 10/2007 |
| JP | 2007-281072 A | 10/2007 |
| JP | 2007-307442 A | 11/2007 |
| JP | 2008-256972 A | 10/2008 |
| JP | 4185941 B2 | 11/2008 |
| JP | 2009056719 A | 3/2009 |
| KR | 10-2009-0109116 A | 10/2009 |
| TW | I280160 B | 5/2007 |

* cited by examiner

*Primary Examiner* — Dah-Wei D Yuan
*Assistant Examiner* — Stephen Kitt
(74) *Attorney, Agent, or Firm* — Canon U.S.A., Inc. IP Division (57) ABSTRACT

An imprint apparatus performs processing including dispensing of a resin onto an imprint region on a substrate and molding of the dispensed resin using a mold. The imprint apparatus includes a dispenser including a discharge section having an array of ports for discharging the resin, and configured to dispense the resin onto the imprint region; and a controller configured to control the dispenser, during a processing for a plurality of imprint regions of which nominal sizes are the same, such that switching is performed from one subset of the array of ports used for dispensing the resin onto one imprint region to another subset of the array of ports for dispensing the resin onto another imprint region.

15 Claims, 7 Drawing Sheets

IMPRINT APPARATUS, IMPRINT METHOD, AND ARTICLE MANUFACTURING METHOD

BACKGROUND OF THE INVENTION

Field of the Invention

The present invention relates to an imprint apparatus, an imprint method, and an article manufacturing method.

Description of the Related Art

Imprint technique is a technique that enables transfer of fine nanoscale patterns. This technique is being put to practical use as a nanolithography technique that is applicable to mass production of magnetic storage media and semiconductor devices. In the imprint technique, a fine pattern is formed on a substrate such as a silicon wafer or a glass plate by using, as an original, a mold with a fine pattern formed by an apparatus such as an electron-beam drawing apparatus. The fine pattern is formed by dispensing an imprint resin onto the substrate and curing the resin while the resin and the pattern on the mold are pressed together.

Imprint techniques currently in practical use are a heat-cycle method and a photo-cure method. In the heat-cycle method, a thermoplastic imprint resin is heated to a glass transition temperature or higher to increase fluidity of the resin. Then, the resin and the mold are pressed together. After cooling, the mold is separated from the resin and thus a pattern is formed. In the photo-cure method, in which a photo-curable (ultraviolet (UV)-curable) imprint resin is used, the resin is cured by UV irradiation while the resin and the mold are pressed together. The mold is then separated from the cured resin and thus a pattern is formed. Note that in the present application, an uncured photo-curable imprint resin (e.g., monomer resin) will also be referred to as a resin, for simplicity. The heat-cycle method, which involves controlling the temperature of resin, requires a long transfer time. Moreover, changes in resin temperature cause changes in resin dimensions. The photo-cure method does not suffer from such problems and thus is advantageous in mass production of nanoscale semiconductor devices.

Up to the present, various imprint apparatuses have been realized in accordance with various resin curing methods and applications. For mass production of semiconductor devices etc., it is effective to use an apparatus that is capable of repeating dispensing of imprint resin and transfer of a pattern for each imprint region (also referred to as a shot region) on the substrate. Japanese Patent No. 4185941 discloses such an imprint apparatus. This imprint apparatus includes units for substrate positioning, resin dispensing, resin molding, light irradiation, and alignment measurement.

A resin used in the imprint apparatus disclosed in Japanese Patent No. 4185941 is dispensed onto the substrate by a dispenser. Dispensers commercially available today have a plurality of ports arranged in one row. For imprinting on a region that is equal in size to a maximum shot region for an exposure apparatus (e.g., a maximum exposure region of 33×26 mm$^2$) currently available, a dispenser having a plurality of ports arranged over a length of 33 mm or 26 mm is suitable.

Since semiconductor devices vary in size, the actual exposure region will not necessarily be of the same size as the maximum exposure region of 33×26 mm$^2$. The same applies to the imprint apparatus. That is, even if the imprint apparatus has a dispenser capable of dispensing a resin over a length of 33 mm or 26 mm, all ports of the dispenser may not necessarily be used all the time.

Due to demand for high-speed filling of resin into the mold, a UV-curable resin of high volatility can be used as an imprint resin. Therefore, if ports are not used for a long period of time (e.g., several hours), the resin in the ports vaporizes almost entirely. However, the resin does not completely disappear and the ports may be clogged with residual resin. If some ports are not used for a long time, uniform dispensing of resin may not be achieved. Therefore, to use such ports again, it is necessary to discharge resin from the ports multiple times before dispensing of resin onto the substrate. This discharge operation may be referred to as "idle discharging".

SUMMARY OF THE INVENTION

The present invention provides, for example, an imprint apparatus that is advantageous in terms of a running cost.

According to an aspect of the present invention, an imprint apparatus performs processing including dispensing of a resin onto an imprint region on a substrate and molding of the dispensed resin using a mold. The imprint apparatus includes a dispenser including a discharge section having an array of ports for discharging the resin, and configured to dispense the resin onto the imprint region; and a controller configured to control the dispenser, during a processing for a plurality of imprint regions of which nominal sizes are the same, such that switching is performed from one subset of the array of ports used for dispensing the resin onto one imprint region to another subset of the array of ports for dispensing the resin onto another imprint region.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

First Embodiment

Embodiments of the present invention will now be described with reference to the attached drawings. The present invention is not only useful in forming fine nanoscale patterns, but is applicable to formation of patterns larger than nanoscale patterns.

Figure 2A:
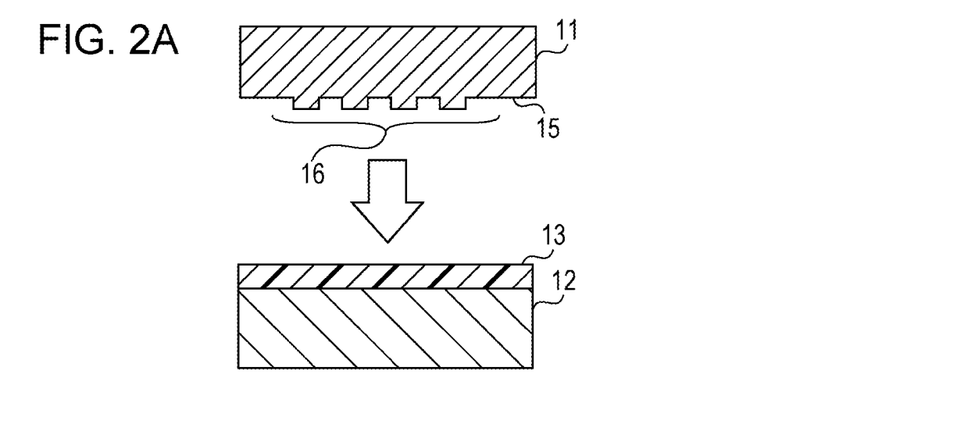
FIG. 2A to FIG. 2C are diagrams for explaining an imprint process based on the photo-cure method.

First, a flow of pattern transfer based on a photo-imprint method will be described with reference to FIG. 2A to FIG. 2C. In the step of FIG. 2A, a mold 11 is pressed against an imprint resin (hereinafter referred to as a resin) 13 dispensed to a substrate 12, such as a silicon wafer or a glass wafer. The resin most often used today is a monomer resin. The mold 11 is made of UV transmitting material, such as quartz. A lower surface (patterned surface) 15 of the mold 11 has a pattern 16 for molding. When the resin 13 and the mold 11 are pressed together, the resin 13 is fluidized and filled into the concave portions of the pattern 16. The resin 13 is thus molded into a certain shape.

Figure 2B:
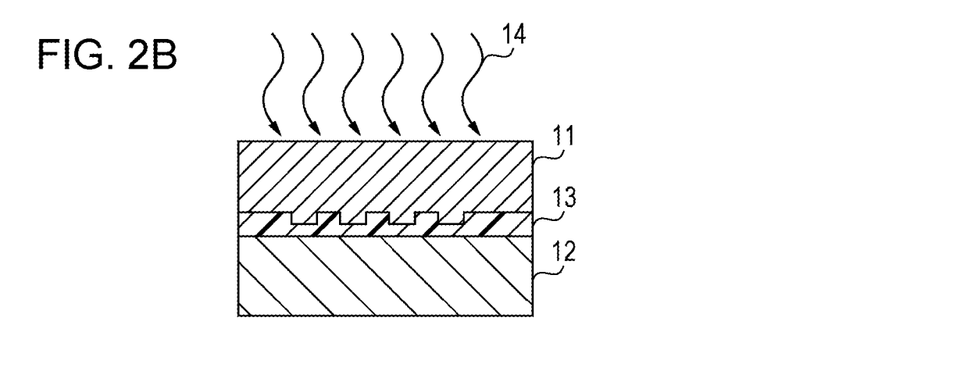

In the step of FIG. 2B, while the resin 13 and the mold 11 are pressed together, a UV light source (not shown) irradiates the resin 13 with UV light 14 through the mold 11. As a result, the resin 13 is cured to conform to the contours of the mold 11.

Figure 2C:
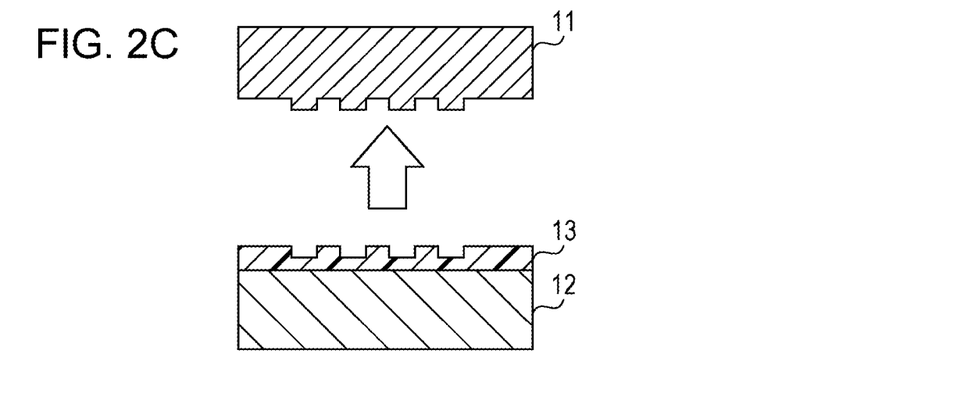

In the step of FIG. 2C, the mold 11 is removed (demolded) from the resin 13 on the substrate 12. The resin 13 with a pattern that conforms to the contours of the mold 11 is cured and left on the substrate 12. Thus, a resin pattern corresponding to the pattern of the mold 11 is formed on the substrate 12. The pattern transferred from the mold 11 to the resin 13 is equivalent to that formed by a known exposure apparatus in the process of photolithography. Therefore, the following process in the manufacture of semiconductor devices may be the same as the process which involves use of the known exposure apparatus.

With the photo-imprint method described above, a fine pattern can be repeatedly formed in (or transferred to) each imprint region (shot region) on the substrate, as in the cases where a semiconductor exposure apparatus such as a stepper is used.

For alignment of the mold 11 with an imprint region on the substrate 12, the mold 11 is provided with an alignment mark used to detect the position and orientation of the mold 11. The substrate 12 is also provided with such an alignment mark.

Figure 3:
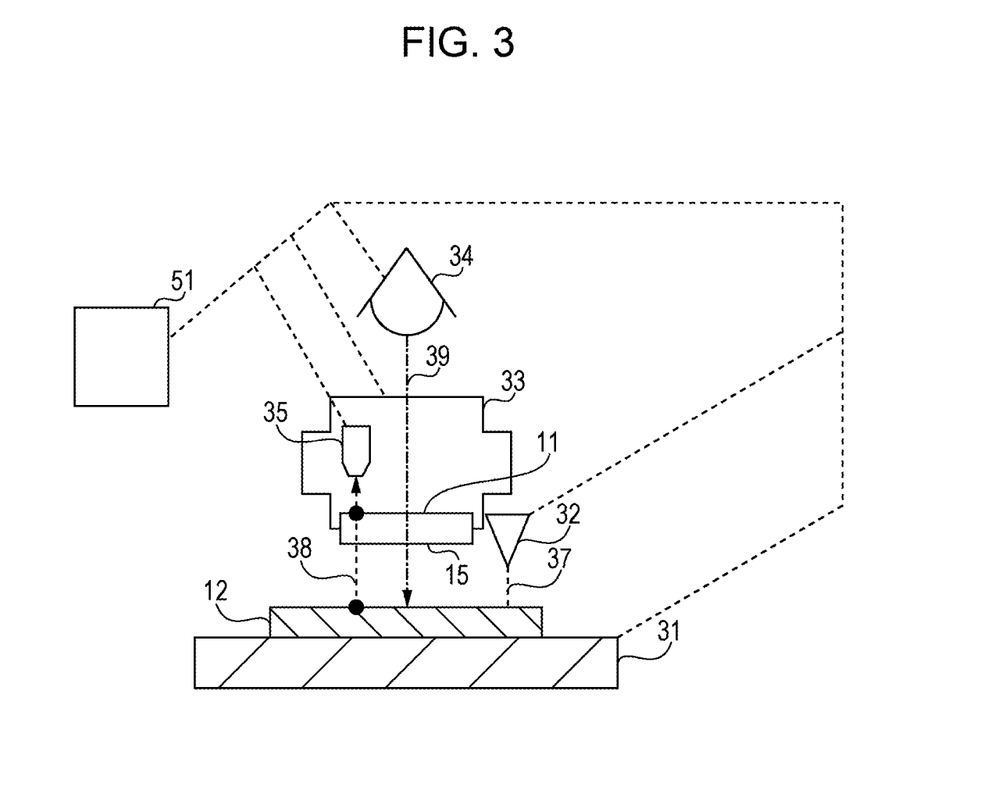
FIG. 3 illustrates a configuration of an imprint apparatus.

A configuration of an imprint apparatus according to a first embodiment will now be described with reference to FIG. 3. A substrate stage 31 is at least horizontally movable while holding the substrate 12. The substrate stage 31 is capable of moving any imprint region on the substrate 12 to a position opposite the mold 11. The substrate stage 31 serves as a driving mechanism that changes relative positions of a discharge section (described below) and the substrate 12. The substrate 12 is held by a substrate chuck included in the substrate stage 31. A dispenser 32 dispenses a photo-curable resin to an imprint region on the substrate 12 held by the substrate stage 31. The dispenser 32 may be, for example, one that is available under the trade name Xaar 760 from Xaar plc. The Xaar 760 is specified to have 764 nozzles (ports) arranged with a pitch of 70.6 µm. With this product, a resin can be dispensed over a length of about 53 mm (0.0706 mm*763=53.9 mm) at one time. When the dispenser 32 is secured in position inside the apparatus, the dispenser 32 dispenses the resin to an imprint region in parallel with a movement, such as a scanning movement, of the substrate stage 31. One side of a region (rectangular region) to which the resin is dispensed in one scanning movement of the substrate stage 31 is defined by the length of the dispenser 32 (e.g., about 53 mm in Xaar 760), and the other side of this region is defined by the distance of the scanning movement of the substrate stage 31.

An imprint head 33 is vertically movable with high precision while holding the mold 11. The imprint head 33 presses the mold 11 against the resin 13 dispensed to the substrate 12 by the dispenser 32 (molding), and removes the mold 11 from the resin 13 (demolding). While the mold 11 and the resin 13 are pressed together, an irradiation optical system (irradiator or illumination optical system) 34 irradiates the resin 13 with light (typically UV light) through the mold 11 to cure the resin 13. For alignment between the mold 11 and the substrate 12, a mark detecting system 35 detects the position of at least one of the alignment marks formed on both the mold 11 and the substrate 12. Reference numeral 37 indicates a path of resin droplets discharged from the dispenser 32. Reference numeral 38 indicates an optical path on which the mark detecting system 35 detects the position of at least one of the alignment marks formed on both the mold 11 and the substrate 12. Reference numeral 39 indicates an optical path along which the irradiation optical system 34 irradiates the resin 13. A controller 51 controls the operation of each of the substrate stage 31, the dispenser 32, the imprint head 33, the irradiation optical system 34, and the mark detecting system 35 described above.

Figure 7A:
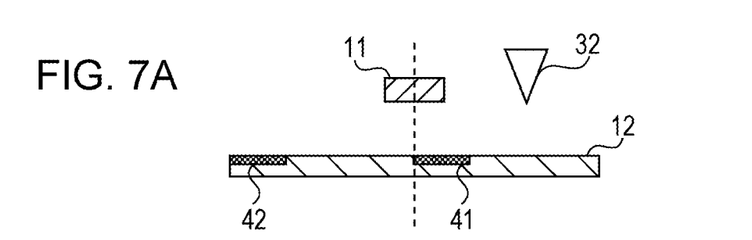
FIG. 7A to FIG. 7D illustrate an imprint operation.
Figure 7B:
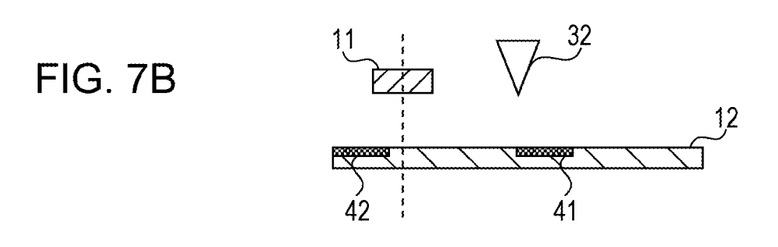
Figure 7C:
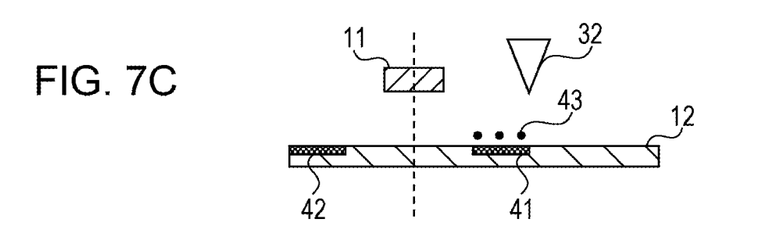
Figure 7D:
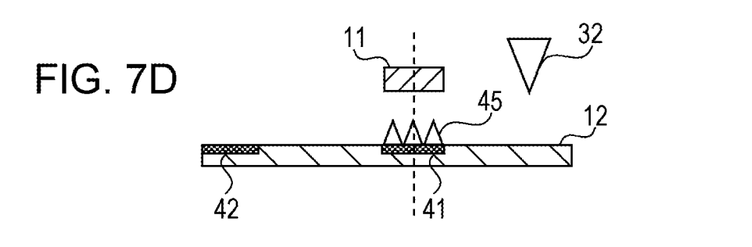

An imprint operation of the imprint apparatus according to the present embodiment will now be described with reference to FIG. 7A to FIG. 7D. FIG. 7A illustrates a state in which the center of the substrate 12 is located directly below the mold 11 held by the imprint head 33. Reference numeral 41 denotes an imprint region near the center of the substrate 12, and reference numeral 42 denotes an imprint region near the outer edge of the substrate 12. FIG. 7B illustrates a state immediately before the dispenser 32 starts dispensing the resin to the imprint region 41 on the substrate 12. As illustrated, the center area of the substrate 12 is located below the dispenser 32. FIG. 7C illustrates a state immediately after the dispenser 32 has completed dispensing the resin to the imprint region 41 on the substrate 12. During the transition from FIG. 7B to FIG. 7C, the dispenser 32 discharges the resin in parallel with movement of the substrate 12 held by the substrate stage 31, so that a resin 43 is dispensed over the entire imprint region 41. FIG. 7D illustrates a state immediately after imprinting, that is, immediately after the resin 43 dispensed to the imprint region 41 on the substrate 12 is cured while the resin 43 and the mold 11 are pressed together and the mold 11 is removed from the resin 43. As illustrated, a resin pattern 45 that conforms to the contours of the patterned surface of the mold 11 is formed in the imprint region 41.

Figure 1A:
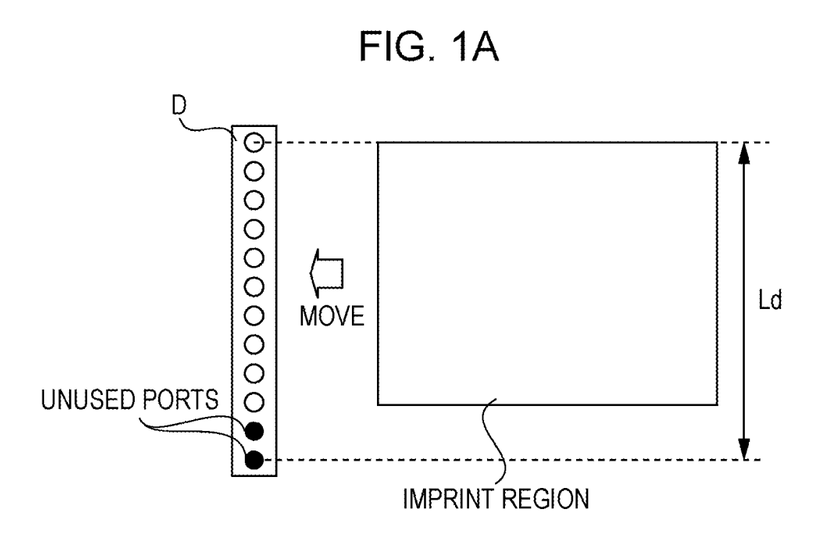
FIG. 1A and FIG. 1B illustrate an aspect of a first embodiment of the present invention.
Figure 1B:
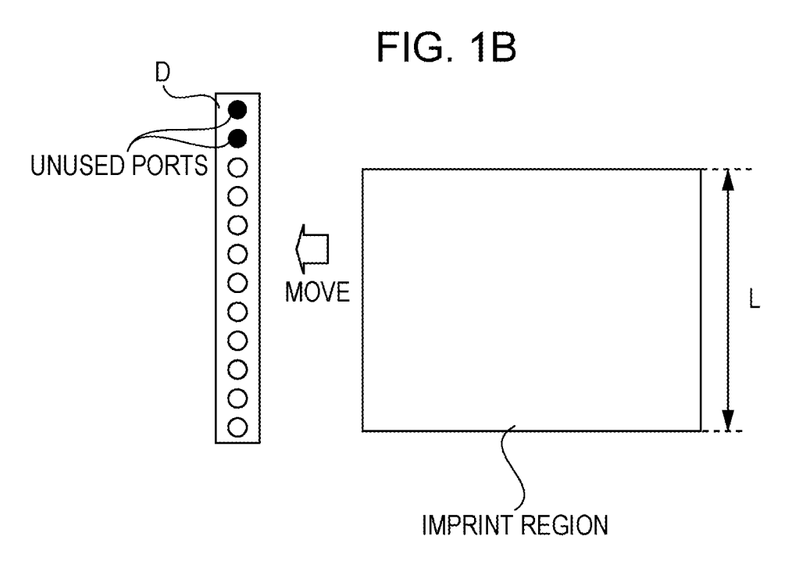

An aspect of an imprint apparatus and method according to the first embodiment of the present invention will now be described with reference to FIG. 1A and FIG. 1B. In FIG. 1A and FIG. 1B, a discharge section D of the dispenser 32 has a total of N ports (also referred to as nozzles), where N is an integer. The ports are arranged with a pitch P. A maximum length Ld over which the discharge section D can dispense a resin in the longitudinal direction of the discharge section D can be expressed as Ld=(N−1)*P. Note that possible spreading of the resin on the substrate after dispensing is not taken into account here.

The length Ld is a length over which the N ports are arranged in the longitudinal direction of the discharge section D. The length Ld defines the length of one side of a rectangular region over which imprinting can be made at one time. In FIG. 1A and FIG. 1B, a length L of one side of an imprint region corresponds to a total of M ports of the discharge section D, where M is an integer smaller than N (N>M). FIG. 1A illustrates the case in which the upper M ports in the drawing are used and the lower N-M ports indicated as UNUSED PORTS are not used.

FIG. 1B illustrates how ports of the discharge section D are used in an imprint region (shot region) following the imprint region illustrated in FIG. 1A. In the case of FIG. 1B, the lower M ports in the drawing are used and the upper N-M ports indicated as UNUSED PORTS are not used. The controller 51 controls the position of the driving mechanism (substrate stage) such that the relative positional relationship between the imprint region and the discharge section D is changed in accordance with switching between groups of ports to be used. The relative positional relationship is changed such that a group of ports to be used and the imprint region are aligned with each other.

By alternately selecting the state of FIG. 1A and the state of FIG. 1B for each imprint region, the total of N ports of the discharge section D can be used, in which the duration of continuous unused time is reduced. This is beneficial for solving the problem to be solved by the present invention.

The timing of switching between sets of ports to be used can be determined on the basis of a property of a resin to be used, throughput demanded for the imprint apparatus, etc. Examples of possible timing options may include every imprint region, every plurality of imprint regions, every line in the imprint region, every plurality of lines in the imprint region, and every substrate (i.e., every time the substrate is replaced).

Figure 5:
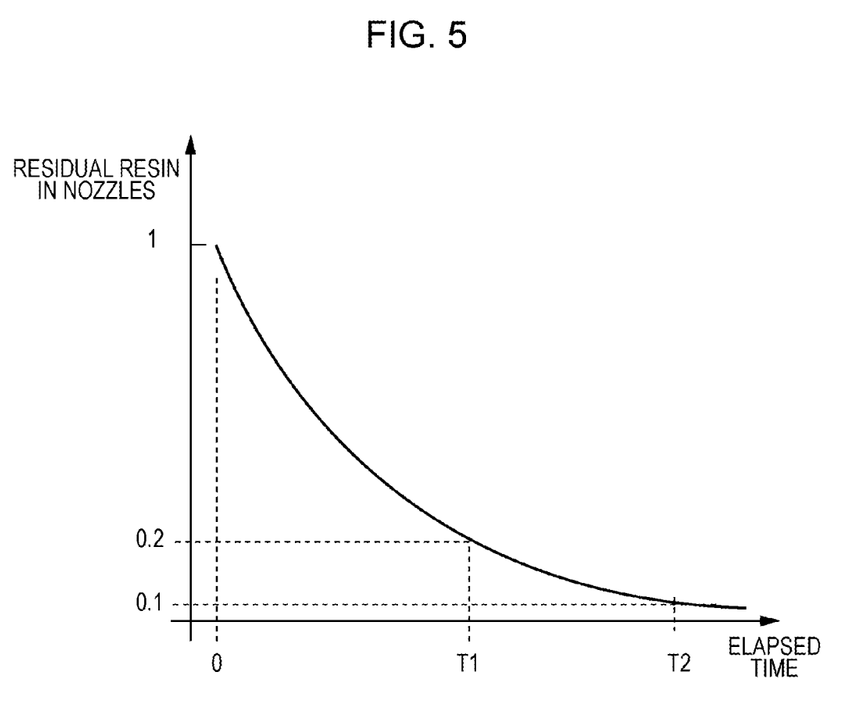
FIG. 5 is a graph showing how the amount of residual resin in ports changes with time.

With reference to FIG. 5, a description will be given of how the amount of residual resin in unused ports changes with time. In FIG. 5, the horizontal axis represents elapsed time and the vertical axis represents the normalized amount of resin remaining in ports. Assume that the amount of resin remaining is "1" at the first elapsed time "0". Since the resin used in the imprint apparatus is highly volatile, the amount of resin decreases to $\frac{1}{5}$ at elapsed time T1 and further decreases to $\frac{1}{10}$ at elapsed time T2. It will be better if the resin disappears completely with time. However, if, for example, the resin is oxidized with time or cured by flare light, the resin may not be properly dispensed from ports that have not been used for a long time. This may lead to the problem to be solved by the present invention.

Figure 6:
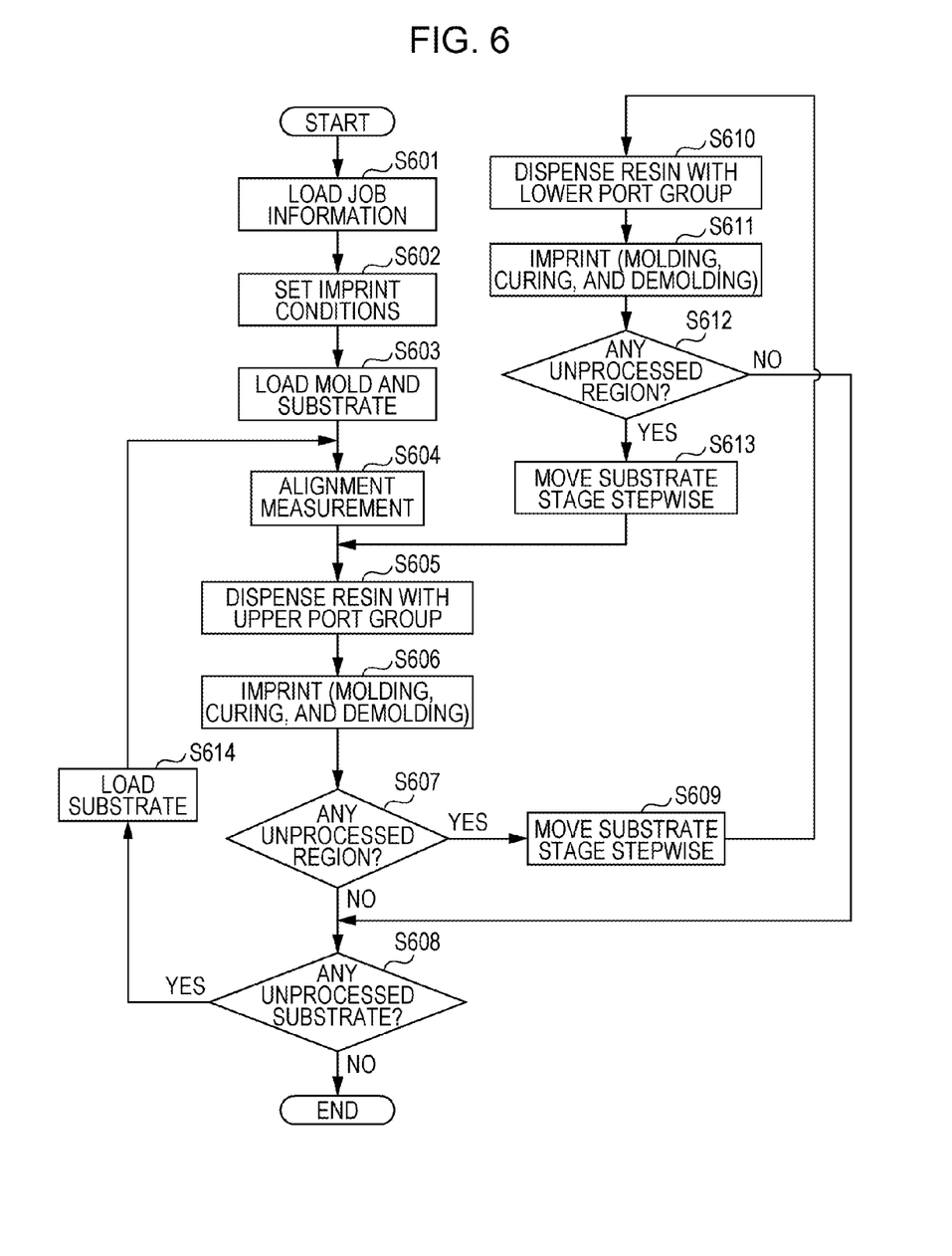
FIG. 6 illustrates a flow of processing in the imprint apparatus.

With reference to FIG. 6, a flow of processing in the imprint apparatus will be described. In this processing, a set of ports to be used is changed for each predetermined region (e.g., for each imprint region). The flow of this operation can be controlled by the controller 51 including a computer, in accordance with a computer-executable program.

In step S601, job information about a job to be executed is loaded into the imprint apparatus. The job information includes recipe information about a recipe of imprint processing. The recipe information includes information about at least one of the following: identification of a mold to be used, identification of a resin to be used, a property of a resin to be used, required throughput, and timing of switching between port groups to be used. In step S602, on the basis of the job information, the controller 51 sets the apparatus operating conditions including modes and timing of switching between port groups. The operating conditions defined in the example of FIG. 6 are that ports to be used are switched, for each imprint region, between a set of upper M ports and a set of lower M ports. Alternatively, a range of ports (port group) to be used may be preset for each imprint region.

In step S603, the mold 11 is loaded into the imprint head 33, that is, a mold chuck of the imprint head 33 is caused to hold the mold 11. At the same time, the substrate 12 is loaded onto the substrate stage 31, that is, the substrate chuck (wafer chuck) of the substrate stage 31 is caused to hold the substrate 12 (wafer).

In step S604, for alignment between the mold 11 and the substrate 12, global alignment measurement is performed using the mark detecting system 35. In global alignment measurement, the mark detecting system 35 detects the positions of alignment marks formed in a plurality of selected imprint regions (sample imprint regions) on the substrate 12 held by the substrate stage 31. On the basis of the detection result, the position of the substrate stage 31 for aligning each imprint region with the mold 11 is determined.

In step S605, while the operation of the substrate stage 31 is controlled on the basis of the measurement in step S604, the resin is dispensed to the first imprint region using a set of ports in the upper part of the discharge section D (upper port group) illustrated in FIG. 1A. In step S606, for this imprint region, the imprint head 33 presses the mold 11 against the resin, the irradiation optical system 34 cures the resin molded using the mold 11, and the imprint head 33 removes the mold 11 from the cured resin.

In step S607, a determination is made as to whether there is any unprocessed imprint region. If there is, the processing proceeds to step S609 and if there is not, the processing proceeds to step S608. In step S609, for switching to the next imprint region, the substrate stage 31 is moved stepwise on the basis of the measurement in step S604.

In step S610, while the operation of the substrate stage 31 is controlled, the resin is dispensed to the next imprint region using a set of ports in the lower part of the discharge section D (lower port group) illustrated in FIG. 1B. In step S611, for this imprint region, the mold 11 is pressed against the resin, the molded resin is cured, and the mold 11 is removed from the cured resin, in the same manner as in step S606.

In step S612, a determination is made as to whether there is any unprocessed imprint region. If there is, the processing proceeds to step S613 and if there is not, the processing proceeds to step S608. In step S613, for switching to the next imprint region, the substrate stage 31 is moved stepwise on the basis of the measurement in step S604. Then, steps S605 and S606 and steps S610 and S611 are alternately performed until no unprocessed imprint regions remain.

In step S608, a determination is made as to whether there is any unprocessed substrate. If there is, the processing proceeds to step S614 and if there is not, the processing ends. In step S614, another substrate is loaded onto the substrate stage 31. The processing then proceeds to step S604 and continues.

As described with reference to the flow of FIG. 6, an imprint operation is performed by switching between sets of ports to be used in the discharge section D with respect to each imprint region. This is beneficial for providing an imprint apparatus having low running costs.

In the example illustrated in FIG. 6, a range of ports to be used is changed for each imprint region. Alternatively, the controller 51 may determine or select the switching timing on the basis of a property of a resin to be used, on the basis of throughput required for the imprint apparatus, or on the basis of both. The user of the imprint apparatus may be allowed to select the timing. Examples of the timing options selectable by the controller 51 or the user are those listed above.

As described above, during processing for a plurality of imprint regions of the same size, the controller controls the dispenser such that the range of ports (port group) for discharging a resin is switched from one to the other. This is beneficial for providing an imprint apparatus having low running costs. The controller may control the dispenser such that, by switching the range of ports (port group) to be used, a resin can be discharged from each port to any imprint region within a predetermined time which depends on a property of the resin. This is also beneficial for providing an imprint apparatus having low running costs. Note that the predetermined time may be the length of time determined on the basis of how the amount of residual resin changes with time, described above with reference to FIG. 5. Alternatively, the predetermined time may be, for example, the length of time determined on the basis of the dispensing precision with which the resin is discharged from ports each time a given period of time elapses. The dispensing precision to be used may be the precision of a characteristic value (e.g., the amount or direction of resin discharged from ports) related to dispensing of resin.

It is desirable that the imprint apparatus include the pot (described above) and an initializing unit that initializes the ports through "idle discharging". In this case, the controller 51 may be configured such that if it fails to cause resin to be discharged from each port within a predetermined time, it is able to cause the initializing unit to initialize the port.

Second Embodiment

An aspect of an imprint apparatus and method according to a second embodiment of the present invention will now be described with reference to FIG. 4A to FIG. 4C. The first embodiment allows switching between two sets (ranges) of ports, while the second embodiment allows switching between three sets of ports.

Figure 4A:
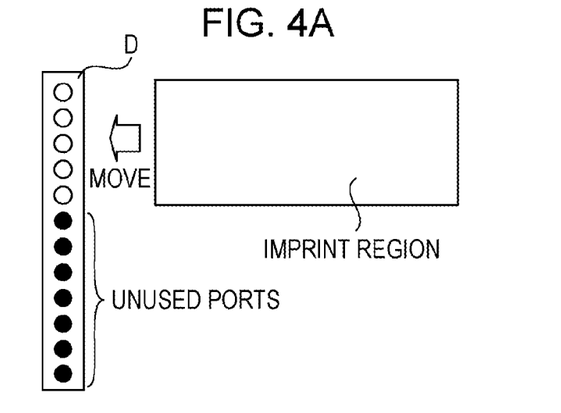
FIG. 4A to FIG. 4C illustrate an aspect of a second embodiment of the present invention.
Figure 4B:
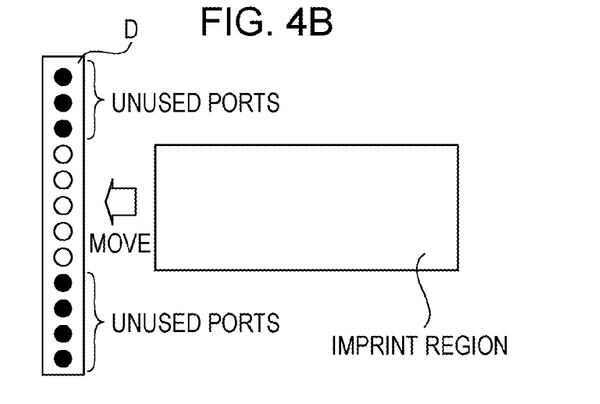
Figure 4C:
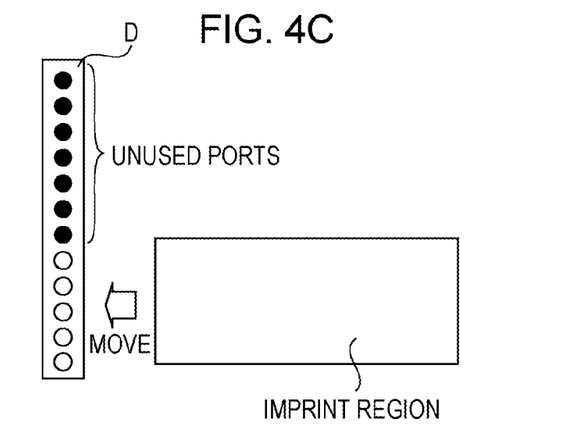

Referring to FIG. 4A to FIG. 4C, the vertical side of the imprint region in the drawing is shorter than half the length of the discharge section D in the longitudinal direction. In this case, with the configuration of the first embodiment (see FIG. 1A and FIG. 1B), some of the ports are left unused. Accordingly, an example of switching between three sets of ports will be described here. For dispensing of resin to an imprint region, ports in the upper part of the discharge section D are used in FIG. 4A, ports in the center of the discharge section D are used in FIG. 4B, and ports in the lower part of the discharge section D are used in FIG. 4C.

As in the case of the first embodiment, the timing of switching between a plurality of port ranges can be selected from the options such as those described above, on the basis of a property of a resin to be used, throughput required for the imprint apparatus, etc.

Thus, the configuration of the second embodiment is beneficial for providing an imprint apparatus having low running costs.

The imprint apparatus may be equipped with a discharge section having ports greater in number than N ports corresponding to a length of one side of a maximum imprint region defined in the specification. Even in this case, if ports other than specified N ports are regarded as invalid ports and thus are not used, the present invention is applicable to the imprint apparatus, which can be regarded as being equipped with a discharge section (valid discharge section) having the specified N ports. This is because since the invalid ports are not used, it is not necessary to take their conditions into account. These features of the present invention are beneficial for providing an imprint apparatus having low running costs.

Each of a plurality of port ranges (port groups) to be switched from one to another is not limited to that composed of a plurality of continuous ports, but may be one composed of a plurality of discontinuous ports depending on the density (or arrangement) of concave portions of the mold.
Embodiment of Article Manufacturing Method A method of manufacturing articles or devices (e.g., semiconductor integrated circuit elements, liquid crystal display elements, or micro electro-mechanical systems (MEMS)) includes transferring a pattern to (or forming a pattern on) a substrate (e.g., wafer, glass plate, or film substrate) using the imprint apparatus described above. The method may further include etching the substrate to which the pattern has been transferred. For manufacturing other articles, such as patterned media (recording media) or optical elements, the method may include processing the substrate to which the pattern has been transferred, instead of etching it.

While the present invention has been described with reference to exemplary embodiments, it is to be understood that the invention is not limited to the disclosed exemplary embodiments. The scope of the following claims is to be accorded the broadest interpretation so as to encompass, for example, all modifications and equivalent structures and functions.

This application claims the benefit of Japanese Patent Application No. 2009-288817 filed Dec. 21, 2009, which is hereby incorporated by reference herein in its entirety.

What is claimed is:

1. An imprint apparatus that performs processing including dispensing of an imprint material and molding of the dispensed imprint material using a mold with respect to each of a plurality of imprint regions on a substrate, the apparatus comprising:
   a dispenser including a discharge section having an array of ports for discharging the imprint material, and configured to dispense the imprint material;
   a driving mechanism configured to change relative positions of the discharge section and the substrate, the driving mechanism being configured to change the relative positions in a direction perpendicular to an array direction in which ports are arranged in the array of ports while the dispenser dispenses the imprint material; and
   a controller configured to control the dispenser, during the processing for the plurality of imprint regions, such that a first subset of the array of ports is used for dispensing the imprint material onto a first imprint region of the plurality of imprint regions, and a second subset, different from the first subset, of the array of ports is used for dispensing the imprint material onto a second imprint region, different from the first imprint region, of the plurality of imprint regions, to determine, based on information of arrangement of concave portions of a pattern of the mold, the first subset and the second subset such that each of the first subset and the second subset includes a plurality of discontinuous ports depending on the arrangement of the concave portions, and continuous unused time of ports of the array of ports is reduced compared to a case of use of one of the first subset and the second subset, and to control the driving mechanism to change the relative positions of one of the plurality of imprint regions and the discharge section in the array direction in accordance with which of the first subset and the second subset is used for the one of the plurality of imprint regions.

2. The apparatus according to claim 1, wherein sizes of the plurality of imprint regions are the same in the array direction.

3. The apparatus according to claim 1, wherein the controller is configured to determine a timing of switching between the first subset and the second subset in accordance with recipe information for the substrate.

4. The apparatus according to claim 3, wherein the controller is configured to determine the timing of the switching in accordance with information that identifies the imprint material included in the recipe information.

5. The apparatus according to claim 3, wherein the controller is configured to determine the timing of the switching in accordance with information that identifies the mold included in the recipe information.

6. The apparatus according to claim 1, wherein the controller is configured to determine a timing of switching between the first subset and the second subset in accordance with information about required throughput.

7. The apparatus according to claim 1, wherein the controller is configured to preset one of the first subset and the second subset for each of the plurality of imprint regions.

8. The apparatus according to claim 1, wherein the controller is configured to control the dispenser such that switching between the first subset and the second subset is performed in accordance with replacement of the substrate.

9. The apparatus according to claim 1, further comprising an irradiator configured to irradiate the imprint material, molded using the mold, with light to cure the imprint material.

10. An imprint apparatus that performs processing including dispensing of an imprint material and molding of the dispensed imprint material using a mold with respect to each of a plurality of imprint regions on a substrate, the imprint apparatus comprising:
 a dispenser including a discharge section having an array of ports for discharging the imprint material, and configured to dispense the imprint material;
 a driving mechanism configured to change relative positions of the discharge section and the substrate, the driving mechanism being configured to change the relative positions in a direction perpendicular to an array direction in which ports are arranged in the array of ports while the dispenser dispenses the imprint material; and
 a controller configured to control the dispenser such that the imprint material is discharged from each of the array of ports onto at least two of the plurality of the imprint regions within a predetermined time, a first subset of the array of ports being used for dispensing the imprint material onto a first imprint region of the plurality of imprint regions, a second subset, different from the first subset, of the array of ports being used for dispensing the imprint material onto a second imprint region, different from the first imprint region, of the plurality of imprint regions, to determine, based on information of arrangement of concave portions of a pattern of the mold, the first subset and the second subset such that each of the first subset and the second subset includes a plurality of discontinuous ports depending on the arrangement of the concave portions, and continuous unused time of ports of the array of ports is reduced compared to a case of use of one of the first subset and the second subset, and to control the driving mechanism to change the relative positions of one of the plurality of imprint regions and the discharge section in the array direction in accordance with which of the first subset and the second subset is used for the one of the plurality of imprint regions.

11. The apparatus according to claim 10, wherein the controller is configured to determine the predetermined time in accordance with recipe information for the substrate.

12. An imprint apparatus that performs processing including dispensing of an imprint material and molding of the dispensed imprint material using a mold with respect to each of a plurality of imprint regions on a substrate, the apparatus comprising:
 a dispenser including a discharge section having an array of ports for discharging the imprint material, and configured to dispense the imprint material;
 a driving mechanism configured to change relative positions of the discharge section and the substrate, the driving mechanism being configured to change the relative positions in a direction perpendicular to an array direction in which ports are arranged in the array of ports while the dispenser dispenses the imprint material; and
 a controller configured to control the dispenser, during the processing for the plurality of imprint regions, such that a first subset of the array of ports is used for dispensing the imprint material onto a first imprint region of the plurality of imprint regions, and a second subset, different from the first subset, of the array of ports is used for dispensing the imprint material onto a second imprint region, different from the first imprint region, of the plurality of imprint regions, to determine the first subset and the second subset such that the first subset and the second subset are displaced in the array direction by a displacement amount by which continuous unused time of ports of the array of ports is reduced compared to a case of use of one of the first subset and the second subset, and to control the driving mechanism to change the relative positions of one of the plurality of imprint regions and the discharge section in the array direction by the displacement amount in accordance with which of the first subset and the second subset is used for the one of the plurality of imprint regions.

13. An imprint apparatus that performs processing including dispensing of an imprint material and molding of the dispensed imprint material using a mold with respect to each of a plurality of imprint regions on a substrate, the imprint apparatus comprising:
 a dispenser including a discharge section having an array of ports for discharging the imprint material, and configured to dispense the imprint material;
 a driving mechanism configured to change relative positions of the discharge section and the substrate, the driving mechanism being configured to change the relative positions in a direction perpendicular to an array direction in which ports are arranged in the array of ports while the dispenser dispenses the imprint material; and
 a controller configured to control the dispenser such that the imprint material is discharged from each of the array of ports onto at least two of the plurality of the imprint regions within a predetermined time, a first subset of the array of ports being used for dispensing the imprint material onto a first imprint region of the plurality of imprint regions, a second subset, different from the first subset, of the array of ports being used for dispensing the imprint material onto a second imprint region, different from the first imprint region, of the plurality of imprint regions, to determine the first subset and the second subset such that the first subset and the second subset are displaced in the array direction by a displacement amount by which continuous unused time of ports of the array of ports is reduced compared to a case of use of one of the first subset and the second subset, and to control the driving mechanism to change the relative positions of one of the plurality of imprint regions and the discharge section in the array direction by the displacement amount in accordance with which of the first subset and the second subset is used for the one of the plurality of imprint regions.

14. An imprint apparatus that performs processing including dispensing of an imprint material and molding of the dispensed imprint material using a mold with respect to each of a plurality of imprint regions on a substrate, the apparatus comprising:
- a dispenser including a discharge section having an array of ports for discharging the imprint material, and configured to dispense the imprint material;
- a driving mechanism configured to change relative positions of the discharge section and the substrate, the driving mechanism being configured to change the relative positions in a direction perpendicular to an array direction in which ports are arranged in the array of ports while the dispenser dispenses the imprint material; and
- a controller configured to control the dispenser, during the processing for the plurality of imprint regions, such that a first subset of the array of ports is used for dispensing the imprint material onto a first imprint region of the plurality of imprint regions, and a second subset, different from the first subset, of the array of ports is used for dispensing the imprint material onto a second imprint region, different from the first imprint region, of the plurality of imprint regions, to determine, based on information of arrangement of concave portions of a pattern of the mold, the first subset and the second subset such that each of the first subset and the second subset includes a plurality of discontinuous ports depending on the arrangement of the concave portions, and the first subset and the second subset are displaced in the array direction by a displacement amount, depending on the plurality of discontinuous ports, by which continuous unused time of ports of the array of ports is reduced compared to a case of use of one of the first subset and the second subset, and to control the driving mechanism to change the relative positions of one of the plurality of imprint regions and the discharge section in the array direction by the displacement amount in accordance with which of the first subset and the second subset is used for the one of the plurality of imprint regions.

15. An imprint apparatus that performs processing including dispensing of an imprint material and molding of the dispensed imprint material using a mold with respect to each of a plurality of imprint regions on a substrate, the imprint apparatus comprising:
- a dispenser including a discharge section having an array of ports for discharging the imprint material, and configured to dispense the imprint material;
- a driving mechanism configured to change relative positions of the discharge section and the substrate, the driving mechanism being configured to change the relative positions in a direction perpendicular to an array direction in which ports are arranged in the array of ports while the dispenser dispenses the imprint material; and
- a controller configured to control the dispenser such that the imprint material is discharged from each of the array of ports onto at least two of the plurality of the imprint regions within a predetermined time, a first subset of the array of ports being used for dispensing the imprint material onto a first imprint region of the plurality of imprint regions, a second subset, different from the first subset, of the array of ports being used for dispensing the imprint material onto a second imprint region, different from the first imprint region, of the plurality of imprint regions, to determine, based on information of arrangement of concave portions of a pattern of the mold, the first subset and the second subset such that each of the first subset and the second subset includes a plurality of discontinuous ports depending on the arrangement of the concave portions, and the first subset and the second subset are displaced in the array direction by a displacement amount, depending on the plurality of discontinuous ports, by which continuous unused time of ports of the array of ports is reduced compared to a case of use of one of the first subset and the second subset, and to control the driving mechanism to change the relative positions of one of the plurality of imprint regions and the discharge section in the array direction by the displacement amount in accordance with which of the first subset and the second subset is used for the one of the plurality of imprint regions.

* * * * *